United States Patent
Tanaka

(10) Patent No.: US 9,386,206 B2
(45) Date of Patent: Jul. 5, 2016

(54) IMAGING ELEMENT AND IMAGING DEVICE

(71) Applicant: FUJIFILM Corporation, Tokyo (JP)

(72) Inventor: Shunsuke Tanaka, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/500,154

(22) Filed: Sep. 29, 2014

(65) Prior Publication Data

US 2015/0015768 A1     Jan. 15, 2015

Related U.S. Application Data

(63) Continuation of application No. PCT/JP2012/080186, filed on Nov. 21, 2012.

(30) Foreign Application Priority Data

Mar. 30, 2012   (JP) .................. 2012-080667

(51) Int. Cl.
*H04N 5/225* (2006.01)
*H01L 27/146* (2006.01)
(Continued)

(52) U.S. Cl.
CPC ........ *H04N 5/2254* (2013.01); *H01L 27/14621* (2013.01); *H01L 27/14627* (2013.01); *H01L 27/14629* (2013.01); *H04N 5/3696* (2013.01); *H04N 9/07* (2013.01)

(58) Field of Classification Search
CPC ..... H04N 5/2254; H04N 5/3696; H04N 9/07; H01L 27/14629; H01L 27/14627; H01L 27/14621
See application file for complete search history.

(56) References Cited

U.S. PATENT DOCUMENTS

2003/0063210 A1   4/2003   Tsuboi
2006/0158547 A1   7/2006   Komatsu et al.
2006/0181629 A1   8/2006   Miyashita et al.
(Continued)

FOREIGN PATENT DOCUMENTS

JP   2003-92392 A    3/2003
JP   2006-228938 A   8/2006
(Continued)

OTHER PUBLICATIONS

Chinese Office Action and Search Report, dated Jun. 2, 2015, for Chinese Application No. 201280072169.7, with an English translation.
International Search Report issued in PCT/JP2012/080186, mailed on Dec. 25, 2012.
PCT/ISA/237—Issued in PCT/JP2012/080186, mailed on Dec. 25, 2012.

*Primary Examiner* — Tuan Ho
(74) *Attorney, Agent, or Firm* — Birch, Stewart, Kolasch & Birch, LLP

(57) ABSTRACT

An imaging element includes: a semiconductor substrate in which a plurality of pixels is arranged in a two-dimensional array; a color filter layer which is laminated in a position corresponding to the pixel on an upper layer of the semiconductor substrate; a plurality of micro lenses which is laminated on an upper layer of the color filter layer to condense light which is incident onto the pixel; and an isolated columnar reflective wall which is vertically provided in an intermediate layer between the semiconductor substrate and the micro lens at every position of a gap enclosed by the plurality of adjacent micro lenses and reflects the light which is incident onto the color filter from the gap to a direction facing the pixel corresponding to the color filter.

10 Claims, 19 Drawing Sheets

(51) Int. Cl.
*H04N 9/07* (2006.01)
*H04N 5/369* (2011.01)

(56) References Cited

U.S. PATENT DOCUMENTS

| | | |
|---|---|---|
| 2010/0060769 A1 | 3/2010 | Inuiya |
| 2010/0265384 A1* | 10/2010 | Tay .................... H01L 27/14625 |
| | | 348/336 |
| 2011/0242350 A1* | 10/2011 | Sawayama ........ H01L 27/14629 |
| | | 348/222.1 |
| 2011/0279727 A1 | 11/2011 | Kusaka |
| 2011/0298074 A1 | 12/2011 | Funao |
| 2014/0152878 A1* | 6/2014 | Ozawa .............. H01L 27/14621 |
| | | 348/273 |

FOREIGN PATENT DOCUMENTS

| | | | | |
|---|---|---|---|---|
| JP | 2006-295125 A | | 10/2006 | |
| JP | 2009-88415 A | | 4/2009 | |
| JP | 2009-182223 A | | 8/2009 | |
| JP | 2010-67827 A | | 3/2010 | |
| JP | 2011-119445 | * | 6/2011 | ............. H04N 5/335 |
| JP | 2011-119445 A | | 6/2011 | |
| JP | 2011-176715 A | | 9/2011 | |
| JP | 2011-193047 A | | 9/2011 | |
| JP | 2011-258728 A | | 12/2011 | |

* cited by examiner

IMAGING ELEMENT AND IMAGING DEVICE

CROSS REFERENCE TO RELATED APPLICATION

This is a continuation of International Application No. PCT/JP2012/080186 filed on Nov. 21, 2012, and claims priority from Japanese Patent Application No. 2012-080667 filed on Mar. 30, 2012, the entire disclosures of which are incorporated herein by reference.

BACKGROUND

1. Technical Field

The present invention relates to an imaging element and an imaging device, and more particularly, to an imaging element and an imaging device which have high light receiving sensitivity and excellent color separation performance and are capable of being driven at a high speed.

2. Related Art

A recent single plate type imaging element for imaging a color image which is mounted in a digital camera generally has ten million or more pixels as the number of pixels is increased. In a solid-state imaging element in which the number of pixels is increased, every pixel is miniaturized and a pitch between pixels is narrowed. As a result, a ratio of an amount of incident light onto a predetermined pixel which is leaked to an adjacent pixel, that is, a pixel having different color is increased, which causes color mixture.

Therefore, in the related art, as disclosed in Patent Literature 1 (JP-A-2011-119445) and Patent Literature 2 (JP-A-2009-88415), a light shielding unit having a triangular cross-section is disposed between pixels in order to reduce the leakage of the incident light into the adjacent pixel. As disclosed in Patent Literature 2, the light shielding unit is formed to be high in a direction of a color filter layer or a micro lens layer as a total reflection film so that the amount of leaked incident light into the adjacent pixel may further be reduced.

SUMMARY OF INVENTION

When a light shielding wall having a triangular cross-section is vertically provided between the pixels, the color separation performance is improved. However, when the light shielding wall 6 is provided in a position where the pixels 5 are divided, as illustrated in FIG. 19, the light shielding wall 6 may be provided to have a grid shape (lattice shape) in an example illustrated in FIG. 19. That is, the light receiving surface of the pixel 5 is enclosed by the light shielding wall 6 in all directions.

When a light receiving sensitivity of the pixel which is enclosed by the light shielding wall 6 in all directions of the pixel is calculated by simulation, it is understood that the light receiving sensitivity may be lowered by approximately 20% as compared with a state where the light shielding wall 6 is not provided. In a solid-state imaging element in which the number of pixels is increased, a light receiving area for every pixel is small and an original light receiving sensitivity is not high so that 20%-reduced sensitivity may significantly deteriorate quality of a captured image.

As disclosed in Patent Literature 2, when the light shielding wall 6 having a grid shape is formed as a metal film, an electrical load capacitance component of the light shielding wall 6 is increased, which may cause a problem of lowering a driving speed of the solid-state imaging element.

Illustrative aspects of the present invention provide an imaging element which has high light receiving sensitivity and excellent color separation performance and is capable of being driven at a high speed and an imaging device which is equipped with the imaging element.

An aspect of the present invention provides an imaging element, including: a semiconductor substrate in which a plurality of pixels is arranged in a two-dimensional array; a color filter layer which is laminated in a position corresponding to the pixel on an upper layer of the semiconductor substrate; a plurality of micro lenses which is laminated on an upper layer of the color filter layer to condense light which is incident onto the pixel; and an isolated columnar reflective wall which is vertically provided in an intermediate layer between the semiconductor substrate and the micro lens at every position of a gap enclosed by the plurality of adjacent micro lenses and reflects the light which is incident onto the color filter from the gap to a direction facing the pixel corresponding to the color filter.

Another aspect of the present invention provides an imaging device in which the imaging element is mounted.

According to any one of the aspects of the present invention, an isolated columnar reflective wall is provided at every gap between micro lenses so that the leakage of the incident light into the adjacent pixel is prevented to suppress the color mixture and the light shielding wall is provided to have an isolated island shape so that the light receiving sensitivity of the pixel may not be lowered. Although the light shielding wall is formed of metal, the light shielding wall has an isolated island shape so that the electrical load capacitance is reduced, which does not cause a difficulty in high-speed driving.

DESCRIPTION OF EMBODIMENTS

Hereinafter, one embodiment of the present invention will be described with reference to drawings.

Figure 1:
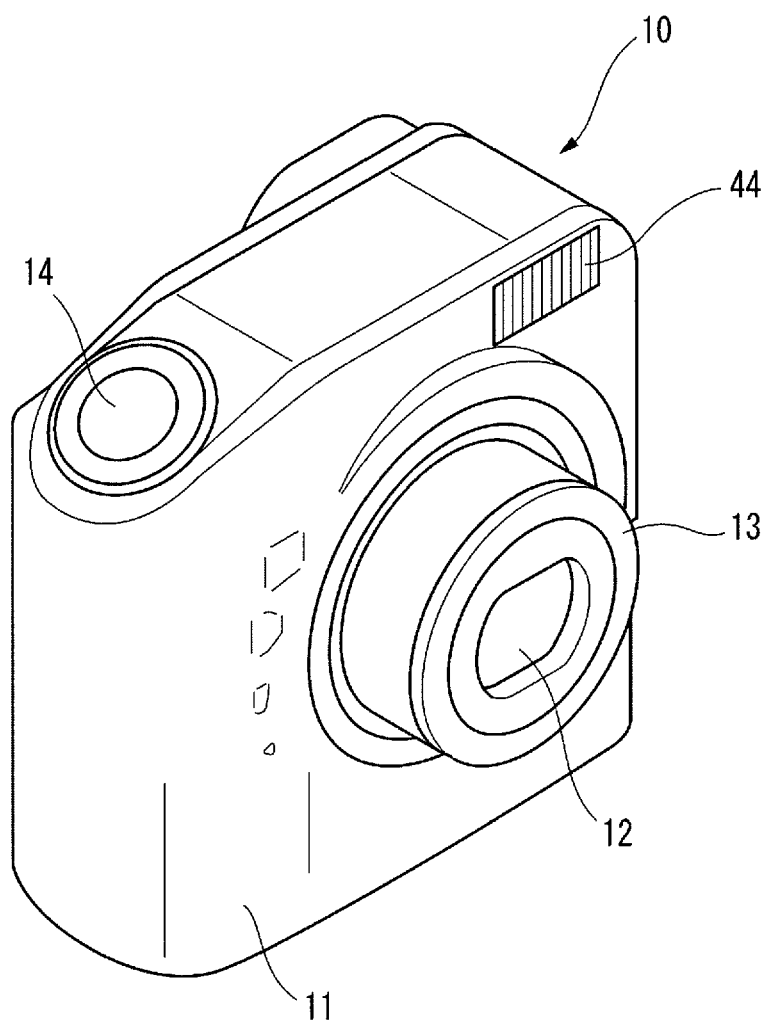
FIG. 1 is a perspective view of an outer appearance of an imaging device according to a first embodiment of the present invention.

FIG. 1 is a perspective view of an outer appearance of an imaging device (digital camera) 10 according to one embodiment of the present invention. The digital camera 10 is provided with a photographing lens 12 in the front of a rectangular housing 11. The photographing lens 12 is accommodated in a retractable lens barrel 13. A shutter release button 14 is provided on a left shoulder portion so as to face the housing 11. On a rear surface of the housing 11, a liquid crystal display (an LCD 16 of FIG. 2) which displays a photographed image, a through image (a live view image) or a camera menu image is provided. A flash light emitting unit 44 is provided in the front of a right shoulder portion.

Figure 2:
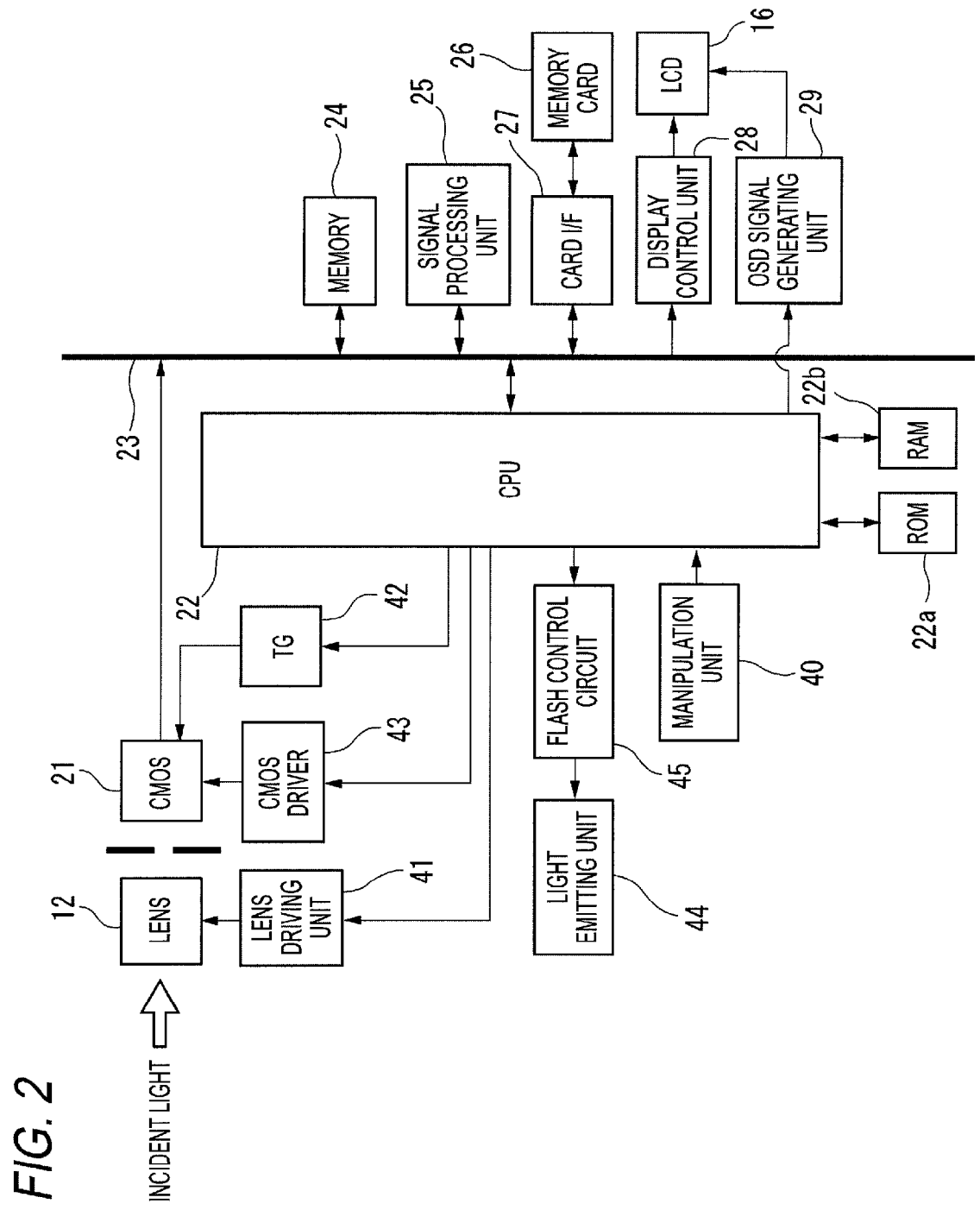
FIG. 2 is a functional block diagram of the imaging device illustrated in FIG. 1.

FIG. 2 is a functional block diagram of a digital camera illustrated in FIG. 1. The digital camera 10 includes a solid-state imaging element (a back side illumination type CMOS image sensor in this embodiment) 21 provided at the back of the photographing lens 12 and a central operation processing device (CPU) 22 which integratedly and comprehensively controls the digital camera 10.

The CPU 22 is connected to a bus 23 and a frame memory 24, a signal processing unit (DSP) 25 which performs an image processing, a card interface (I/F) 27 which stores photographed image data which is compressed by a JPEG format in an external memory card 26, a display control unit 28 which controls display of the LCD (the liquid crystal display unit) 16 at the rear surface of the camera, and an OSD signal generating unit 29 which generates an OSD signal such as character information to be displayed on the LCD 16 are connected to the bus 23.

A ROM 22a or a RAM 22b in which a control program is stored is connected to the CPU 22 and a manipulation unit 40 which includes the shutter release button 14 is also connected thereto. The digital camera 10 is equipped with a lens driving unit 41 which controls a position of a focus lens of the photographing lens 12, a timing generator (TG) 42 which generates a driving timing signal of the solid-state imaging element 21, a driver 43 which drives the solid-state imaging element 21, and a flash control circuit 45 which controls emission of the light emitting unit 44, which are controlled and instructed by the CPU 22.

The CPU 22 performs various control processings using a controlled DSP 25. For example, in the case of the solid-state imaging element 21 on which a phase difference detecting pixel which will be described below is mounted, a signal which is output from the phase difference detecting pixel is processed to calculate a distance to a subject and adjust a position of the focus lens of the photographing lens 12 to image an image which is focused on a subject.

Alternatively, in the case of a solid-state imaging element 21 in which all the pixels serve as the phase difference detecting pixels, an image of the subject viewed by a left eye and an image of the subject viewed by a right eye are generated from image signals captured by one of phase difference detecting pixel pair and the other one to generate a stereoscopic image.

Figure 3:
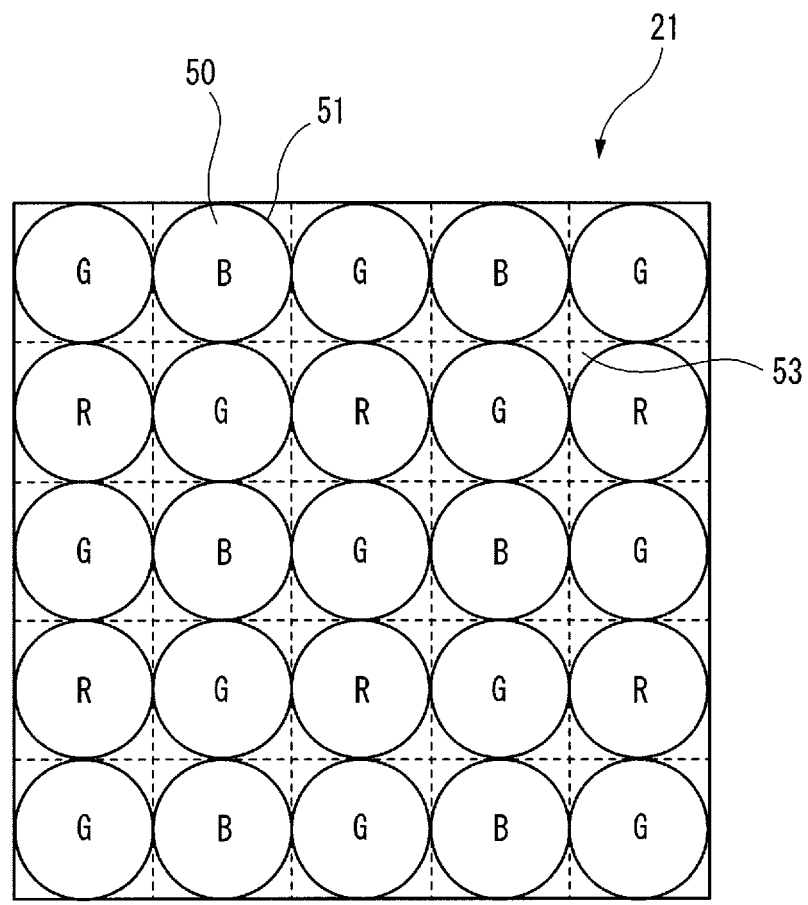
FIG. 3 is a schematic surface view of a solid-state imaging element illustrated in FIG. 2.

FIG. 3 is a schematic surface view illustrating an example of the solid-state imaging element 21. On a semiconductor substrate, a plurality of pixels (photoelectric converting units) 50 is formed in a two-dimensional array shape, for example, a square lattice shape. Micro lenses (on-chip lenses) 51 represented by a symbol O are formed at an upper side of each pixel 50. R (red), G (green), and B (blue) denoted on each pixel 50 indicate colors of color filters. In this embodiment, a solid-state imaging element 21 in which color filters of three primary colors are arranged in a Bayer pattern is illustrated.

Figure 4:
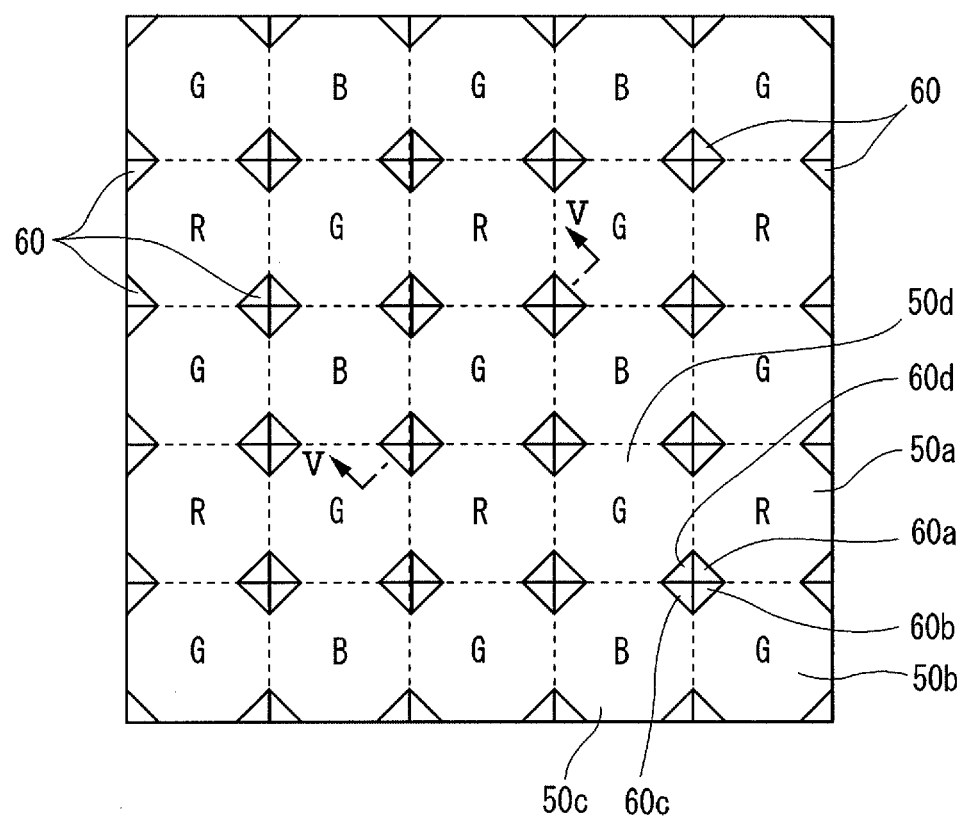
FIG. 4 is a schematic surface view of a lower layer of the micro lens layer illustrated in FIG. 3.
Figure 19:
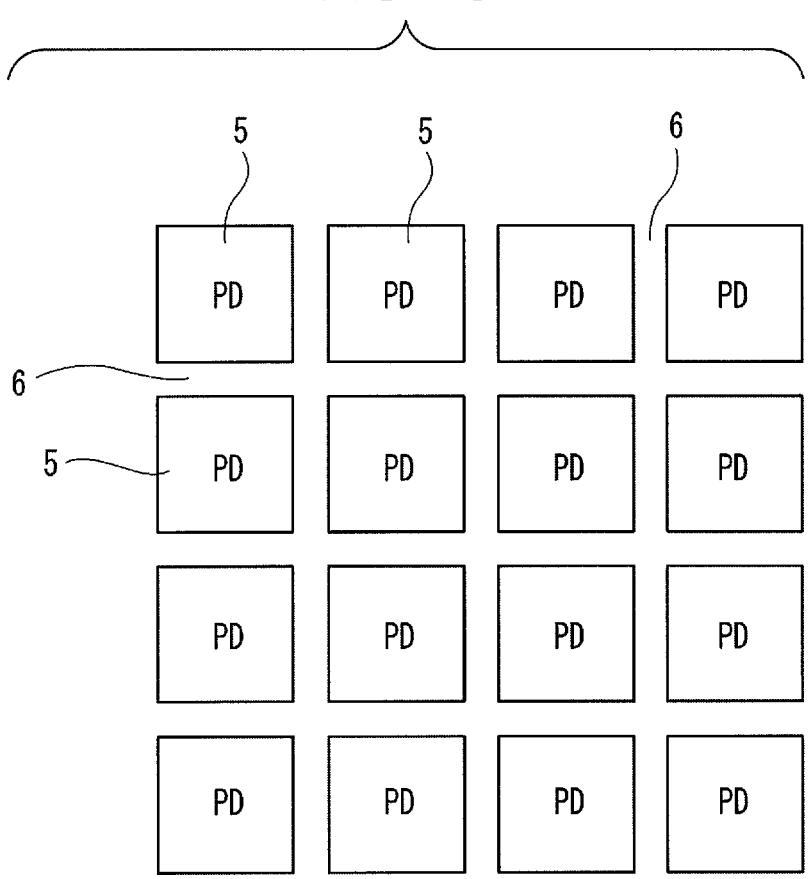
FIG. 19 is an explanatory view of a solid-state imaging element of the related art.

FIG. 4 is a view of the semiconductor substrate when viewed from a lower side of the micro lens layer in FIG. 3. A position in the solid-state imaging element 21 where a plurality of isolated columnar reflective walls 60 of the embodiment is provided is illustrated. As compared with the grid shaped light shielding wall 6 of FIG. 19, in the present embodiment, an island shaped reflective wall 60 is vertically provided only in a position of a grid-shaped lattice point.

Here, difference between a principle in the embodiment of the present invention and those of Patent Literatures 1 and 2 in the related art will be described. The light shielding wall disclosed in Patent Literature 1 or Patent Literature 2 is provided to further guide light refracted by the micro lens to the pixel portion so that the light shielding wall needs to be formed inside the micro lens. However, the inventor of the present application found that an effect which prevents the color mixture caused by light which is incident onto a gap 53 (which will be described below) which is formed between adjacent micro lenses is insufficient and light which mainly affects the color mixture is light which is incident onto the gap 53 formed between the adjacent micro lenses, so that an island shaped reflective wall 60 which is described in the embodiment is provided.

The light shielding wall disclosed in Patent Literature 1 or Patent Literature 2 is formed to have a grid shape so that the light shielding wall is formed even in a location other than the gap formed between a plurality of adjacent micro lenses. Therefore, light which is refracted by the micro lens to be directed to the pixel is also shielded so that sensitivity is further lowered in some cases. To the contrary, in the embodiment of the present invention in which the island shaped reflective wall 60 is provided only in a necessary location, the lowering of sensitivity may be suppressed to the minimum.

As illustrated in FIG. 3, in a location where four micro lenses 51 are adjacent to each other, a rectangular gap 53 becomes larger. That is, a gap of the pixels in a diagonal position is increased. Most of the incident light which is leaked into the adjacent pixel is light which passes through the gap 53 to be incident without passing through the micro lens 51. The incident light which passes through the micro lens 51 is refracted to the center of the pixel by the micro lens but the light which is incident onto the gap 53 is not refracted by the micro lens but is incident onto the adjacent pixel.

Therefore, the reflective wall 60 may be formed to have a quadrangular pyramid shape having four reflective surfaces so that the light which enters from the gap 53 is reflected to the pixel at the incident side. The reflective wall is desirably manufactured such that an apex position thereof becomes a lattice point position (a center position of the gap 53: this position coincides with a divided position for each pixel of the color filter).

The light which is reflected from the reflective surfaces of the quadrangular pyramid is incident onto a pixel which the reflective surface faces. That is, in the case of the reflective wall 60 at a lower right side of FIG. 4, the reflective wall 60 having a quadrangular pyramid shape is manufactured such that a reflective surface 60a faces a pixel 50a, a reflective surface 60b faces a pixel 50b, a reflective surface 60c faces a pixel 50c, and a reflective surface 60d faces a pixel 50d. The columnar reflective wall 60 may have a conical shape rather than the quadrangular pyramid shape if reflective light of the incident light by the reflective wall 60 is incident to a pixel which the reflective surface faces.

Figure 5:
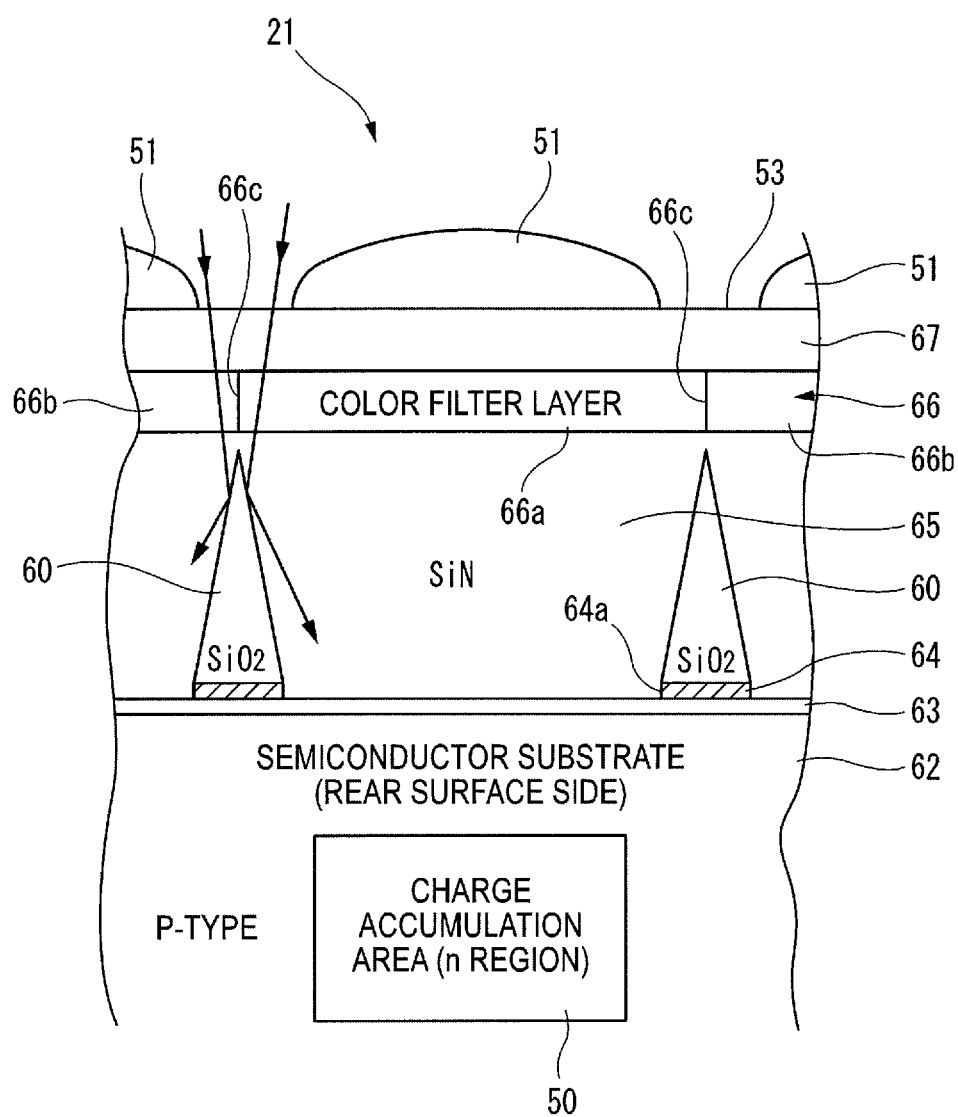
FIG. 5 is a schematic cross-sectional view of the V-V line of FIG. 4.

FIG. 5 is a schematic cross-sectional view taken along line V-V of FIG. 4. A transparent insulating layer 63 is laminated on a rear surface of the semiconductor substrate 62 and a light shielding film 64 is laminated thereon. The light shielding film 64 has an opening 64a which is formed in a position corresponding to the pixel and has a grid shape when viewed from the top. A charge accumulating area (a photoelectrically converting area) which serves as a pixel 50 is formed on a surface of the semiconductor substrate which faces the opening 64a of the light shielding film.

A quadrangular pyramid shaped reflective wall 60 is vertically provided on a position of a grid-shaped lattice point of the light shielding film 64. In the present embodiment, the reflective wall 60 is formed of silicon dioxide (SiO2). A silicon nitride (SiN) layer 65 is laminated on an upper layer of the rear surface of the semiconductor substrate 62 excluding the reflective wall 60 so that the top surface is planarized.

A color filter layer 66 is laminated on the silicon nitride layer 65, a planarization layer 67 is laminated thereon, and a micro lens 51 is formed thereon.

The reflective wall 60 and the color filter layer 66 are formed such that a front end of the reflective wall 60 is aligned in a compartment position 66c of the color filter 66a corresponding to the pixel and a color filter 66b corresponding to an adjacent pixel, among the color filter layer 66.

In the solid-state imaging element 21 with the above-described structure, light from the subject which is incident onto the color filter 66a from the gap 53 between the micro lenses 50 is reflected by the reflective surface of the reflective wall 60 and proceeds toward the pixel corresponding to the color filter 66a. The light which passes through the gap 53 to be incident onto the color filter 66b proceeds toward the pixel corresponding to the color filter 66b. Therefore, the color mixture may be prevented.

Since the reflective walls 60 of the present embodiment are formed to have an isolated island shape without being connected to each other, the light receiving sensitivity of the pixel is not lowered and a subject image may be imaged with high sensitivity and a high S/N.

The reflective wall 60 may be formed as a metal film. Since the reflective wall 60 of the present embodiment has an isolated island shape, the reflective wall 60 may be manufactured by a metal film which is separated from an electrode layer or a wiring layer. This is because the reflective walls 60 are individually isolated so that an electric load capacitance component is small and interruption is not caused even when the solid-state imaging element 21 is driven at a high speed.

A reflective wall 60 which is formed of silicon dioxide illustrated in FIG. 5 may be manufactured as described below. An insulating layer 63 is laminated on the semiconductor substrate 62 and a light shielding film 64 having an opening 64a of the light shielding film is formed. A silicon dioxide layer is thickly laminated thereon.

Next, the silicon dioxide layer in other location is etched while the silicon dioxide layer remains in a portion which forms the reflective wall 60. The etching is performed under a condition that an etching speed in a horizontal direction becomes slow as an etching depth is increased so that an isolated pyramidal columnar reflective wall 60 may be manufactured.

The insulating layer 63 is also etched through the light shielding film opening 64a and then a silicon nitride layer 65 is thickly laminated. Next, after planarizing a surface, the color filter layer 66, the planarization layer 67, and the micro lens layer 51 are laminated.

The reflective wall 60 is formed of silicon dioxide having a low refractive index and a portion which becomes a wave guide of the incident light to the pixel 50 is formed of the silicon nitride layer 65 having a high refractive index, so that the light which is advanced to the reflective wall 60 from the silicon nitride layer 65 is totally reflected. Therefore, the light which is incident from the gap 53 between the micro lenses and totally reflected from the reflective wall 60 is incident onto the corresponding pixel without being lost.

Figure 6:
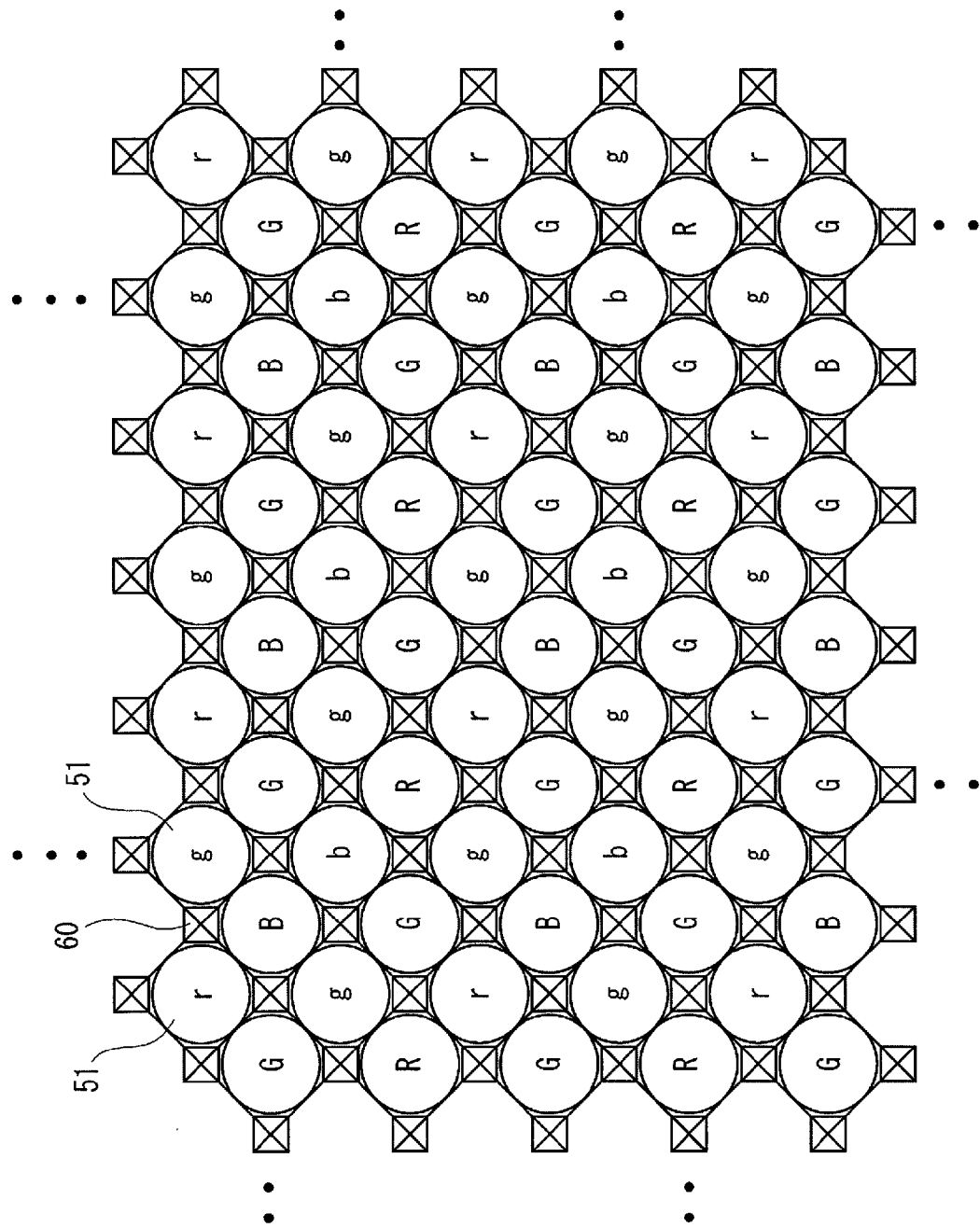
FIG. 6 is a schematic surface view of a second embodiment of the present invention of a solid-state imaging element in which a pixel arrangement is a honey-comb arrangement.

FIG. 6 is a schematic surface view of a solid-state imaging element 21 according to another embodiment of the present invention. The solid-state imaging element 21 is arranged in a so-called honeycomb pixel array in which an odd-numbered pixel row is disposed by being shifted from an even-numbered pixel row by a ½ pixel pitch.

In such a solid-state imaging element 21, a quadrangular pyramid shaped reflective wall 60 is vertically provided in positions of gaps which are formed in adjacent portions of four micro lenses 51 which are laminated in most adjacent four pixels. The reflective wall 60 may have a conical shape. Therefore, the incident light is prevented from being leaked into the adjacent pixel having different color so that the color separation performance is improved. A plurality of isolated island shaped reflective walls 60 is vertically provided so that the light receiving sensitivity of the pixel is not lowered and thus a bright image may be captured.

In the color filter arrangement illustrated in FIG. 6, color filters RGB of three primary colors are arranged in the Bayer arrangement in the odd-numbered pixel rows and color filters r (=R) g (=G) b (=B) of three primary colors are also Bayer-arranged in the even-numbered pixel rows. That is, pixels which are obliquely adjacent to each other have the color filter of the same color.

Figure 7:
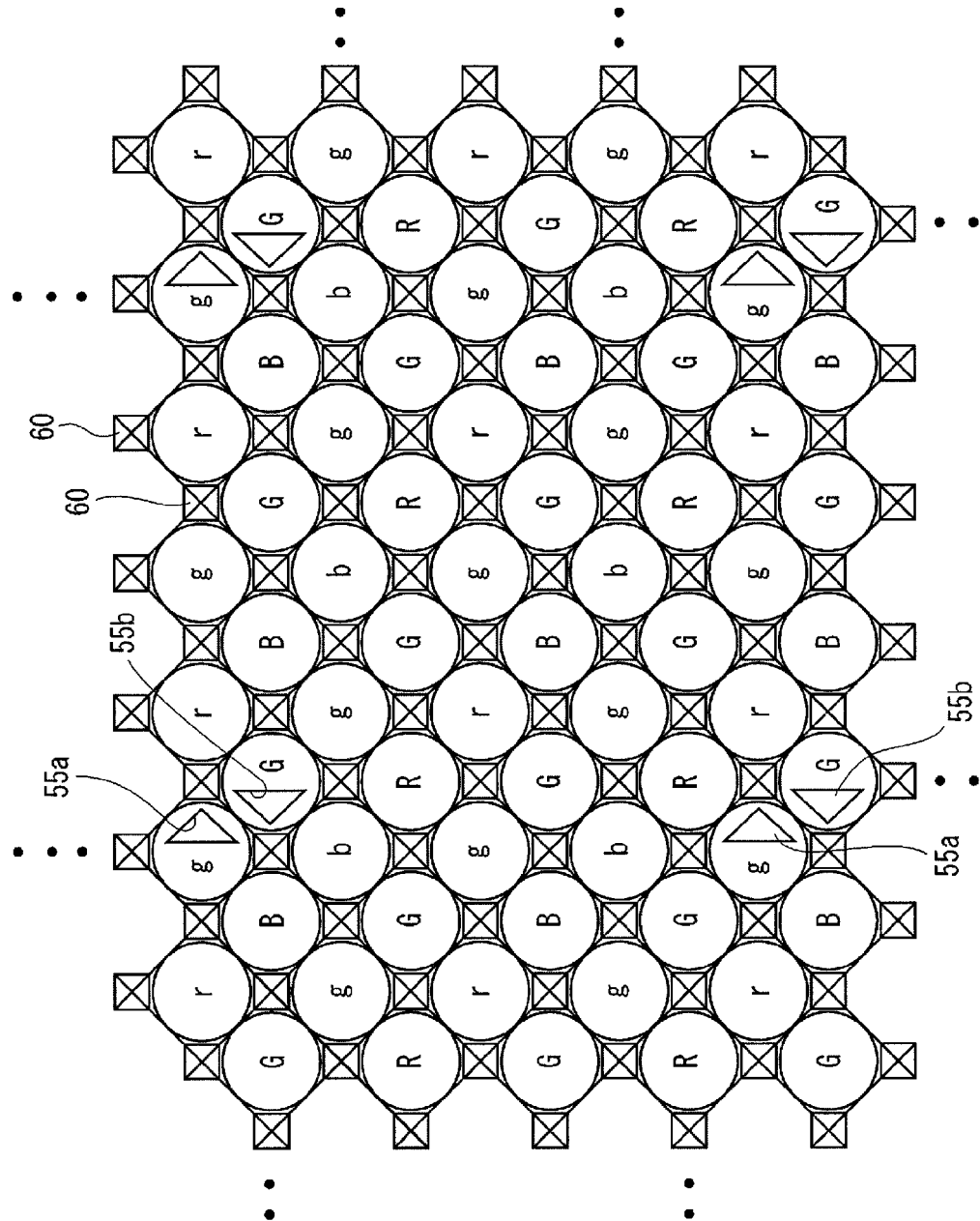
FIG. 7 is a schematic surface view in which phase difference detecting pixels are provided in the embodiment of FIG. 6.

As described above, when two adjacent pixels are the same color pixels, two adjacent pixels form a pair pixel and serve as a phase difference detecting pixel pair. For example, as illustrated in FIG. 7, a light shielding film opening 55a of one of the pair pixels and a light shielding film opening 55b of the other one become smaller than the light shielding film opening 64a (see FIG. 5) of a normal pixel and both openings are provided so as to be off-centered in opposite directions. Therefore, light which views the subject with a right eye is incident onto one of the phase difference detecting pixel pair and light which views the subject with a left eye is incident onto the other one.

The phase difference detecting pixel pair is located in a discrete position on an imaging surface of the solid-state imaging element 21 so that a distance from a detection signal of the phase difference detecting pixel to the subject may be calculated. In the meantime, the solid-state imaging element including the phase difference detecting pixel as described above is already known and specifically is disclosed in Japanese Laid-Open Patent Publication No. 2012-058522.

A light receiving sensitivity of the phase difference detecting pixel having light shielding film openings 55a and 55b whose opening size is smaller than that of a normal pixel is obviously lower than that of the normal pixel. Therefore, when leaked light from neighbor pixels having different colors is incident, the phase difference amount may not be detected with high precision. However, as illustrated in FIG. 7, when the reflective wall 60 is vertically provided in a position of the gap between micro lenses, the color separation performance is improved without sacrificing the light receiving sensitivity so that the phase difference amount may be easily detected with high precision.

In FIG. 7, in order to detect the phase different amount, small light shielding film openings 55a and 55b are provided so as to be off-centered from each other in opposite directions to divide a pupil of the phase difference detecting pixel pair. When the division of the pupil is performed on the pairs of all the pixels which are mounted in the solid-state imaging element 21, a stereoscopic color image of the subject may be captured only by a monocular solid-state imaging element 21.

However, since the light shielding film opening is made small, the light receiving sensitivity of the pixel is lowered. Therefore, the pupil may be divided by mounting one micro lens in the phase difference directing pixel pair by making the light shielding film opening have the same size as the normal pixel. A related art in which the pupil is divided by mounting one micro lens in two pixels to form a phase difference detecting pixel is disclosed, for example, in Japanese Laid-Open Patent Publication No. 2007-281296.

Figure 8:
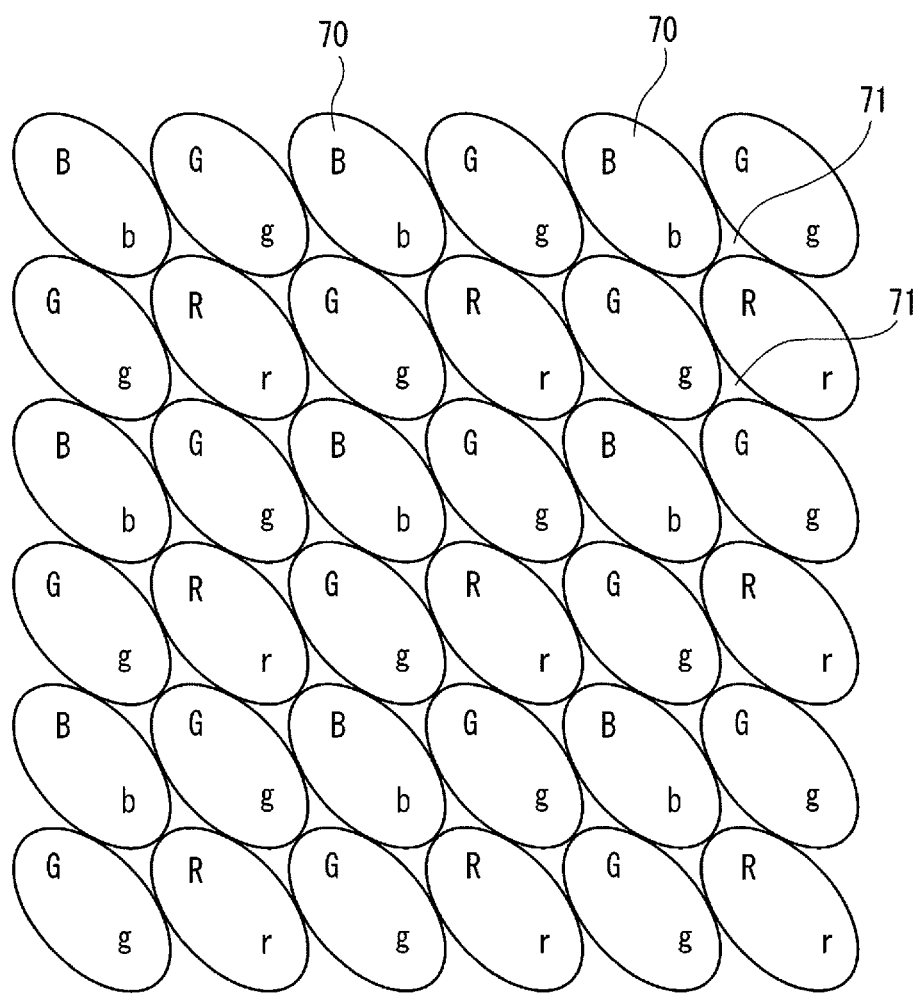
FIG. 8 is a schematic surface view of a solid-state imaging element in which a pixel arrangement is a honey-comb arrangement and overall pixels serve as phase difference detecting pixels by a micro lens sharing manner.

Referring to FIG. 8, a pupil division micro lens 70 having an oval shape is provided in each of the pair of pixels which are obliquely adjacent to each other with the same pixel arrangement and the same color filter arrangement as those of FIG. 6, so as to image a 3D (stereoscopic) image of the subject by one eye.

In this case, prevention of color mixture, that is, a color separation performance is mainly concerned. Therefore, also in the embodiment of FIG. 8, similarly to the above-described embodiments, an isolated columnar reflective wall is provided.

Figure 9:
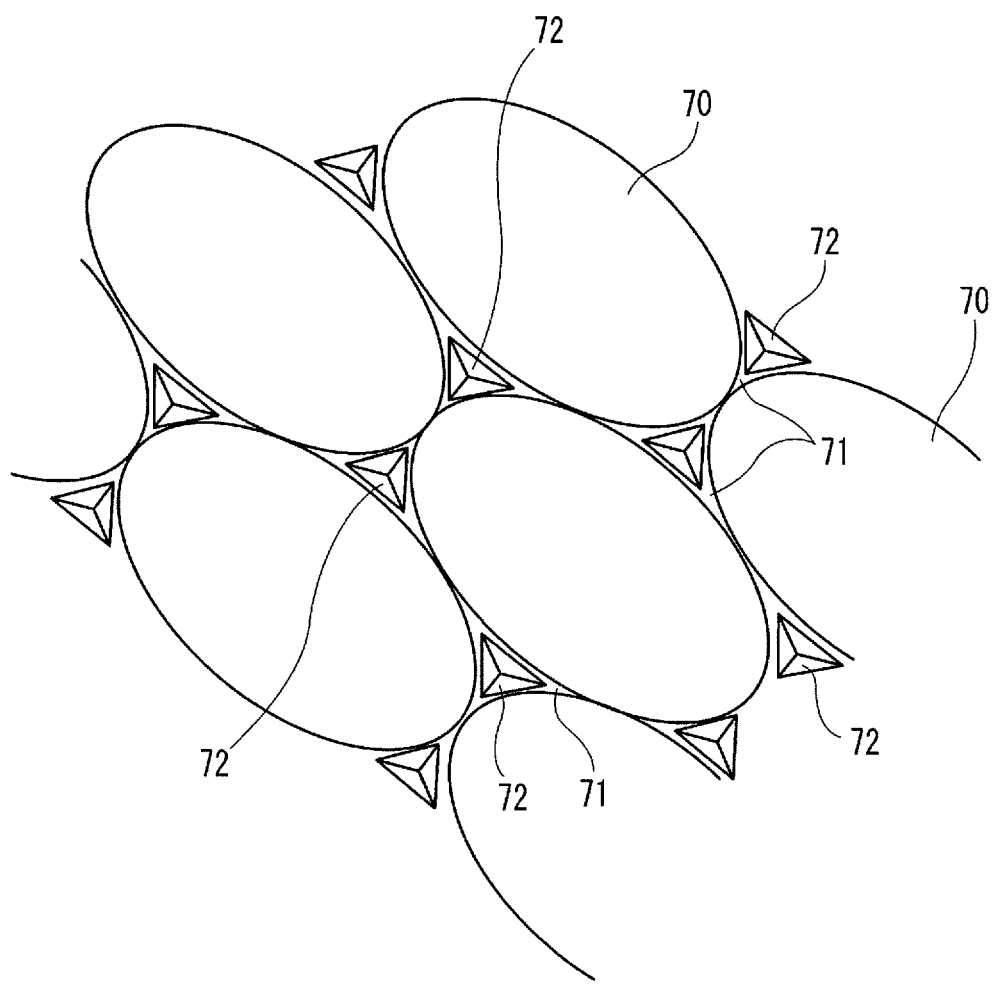
FIG. 9 is a schematic enlarged surface view of main components of a solid-state imaging element in which a reflective wall according to a third embodiment of the present invention is provided in the solid-state imaging element of FIG. 8.

In the embodiment of FIG. 8, elliptical micro lenses 70 are arranged to be parallel to each other in an elliptical direction and in a column which is in one line with a column in an oblique direction of the micro lens 70, the micro lenses 70 are shifted by a half pitch. Therefore, gaps 71 generated by three adjacent micro lenses 70 form a triangle. In FIG. 9, an enlarged view of the gap 71 portion is illustrated and a triangular pyramid shaped reflective wall 72 is vertically provided in the position of the gap 71.

Three micro lenses 70 are adjacent to the reflective wall 72 and the reflective wall 72 is manufactured such that three reflective surfaces of the reflective wall 72 face the pixels below the micro lens 70. Therefore, light which is incident from the gap 71 between the micro lenses is reflected from the reflective surface in an incident direction so that the light is incident onto the pixel which is originally intended to be incident thereon. In the meantime, as described above, the reflective wall 72 may have a conical shape.

Figure 10:
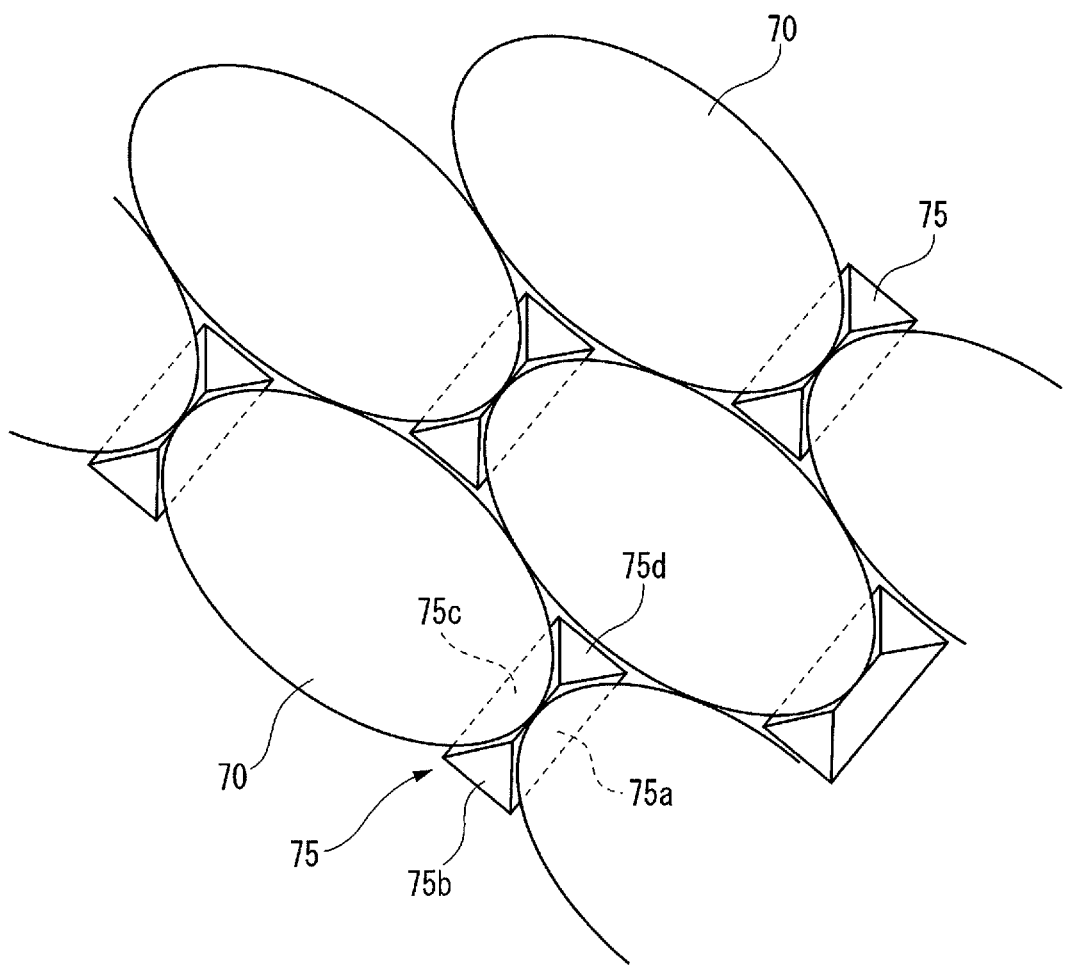
FIG. 10 is a schematic surface view according to a fourth embodiment of the present invention which is different from that of FIG. 9.

In the embodiment illustrated in FIG. 9, a triangular pyramid shaped reflective wall 72 is provided and two adjacent reflective walls 72 are connected to each other to form one flat panel wedge shaped reflective wall 75, as illustrated in FIG. 10.

Figure 11:
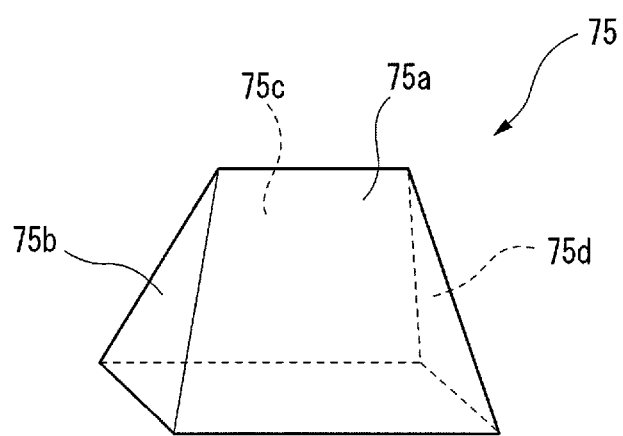
FIG. 11 is a perspective view of an exterior appearance of a wedge shaped reflective wall which is used in the embodiment of FIG. 10.

FIG. 11 illustrates a perspective view of a wedge shaped reflective wall 75. The reflective wall 75 has a trapezoidal shape as seen from the front and has an isosceles triangle as seen from the side and has four reflective surfaces 75a, 75b, 75c, and 75d. The reflective wall 75 is disposed between four micro lenses 70 and each reflective surface is provided so as to face each micro lens. Therefore, light which is incident in a portion of the micro lenses 70 which have a large gap is reflected from the reflective surface so that the color separation performance is improved.

Figure 12:
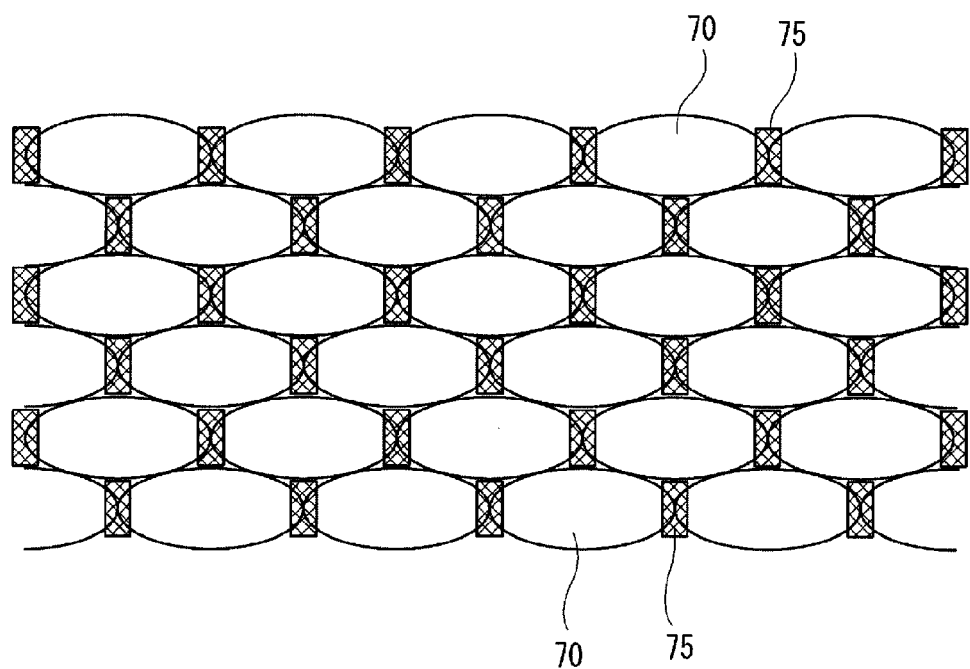
FIG. 12 is a schematic surface view of an embodiment in which the wedge shaped reflective wall of FIG. 10 is employed in a solid-state imaging element whose pixel arrangement is a square lattice arrangement.

FIGS. 8, 9, and 10 illustrate an example in which a pixel arrangement is a honey comb pixel arrangement and one elliptical micro lens 70 is provided in two phase difference detecting pixels which are obliquely adjacent to each other, which is also employed in a solid-state imaging element in which pixels are arranged in a quadrangular lattice pattern. This is illustrated in FIG. 12. In FIG. 12, the elliptical micro lenses 70 are continuous in a horizontal direction.

Also in this embodiment, similarly to the embodiments of FIGS. 8 and 9, a triangular pyramid shaped or conical shaped reflective wall is vertically provided in a portion where a gap between micro lenses 70 is increased, that is, a portion where an arc shaped edge of the micro lens 70 is not in contact with the adjacent micro lens 70 but is spaced apart therefrom. Alternatively, the wedge shaped reflective wall 75 illustrated in FIGS. 10 and 11 may be vertically provided. FIG. 12 illustrates an example in which the reflective wall 75 is provided.

Figure 13:
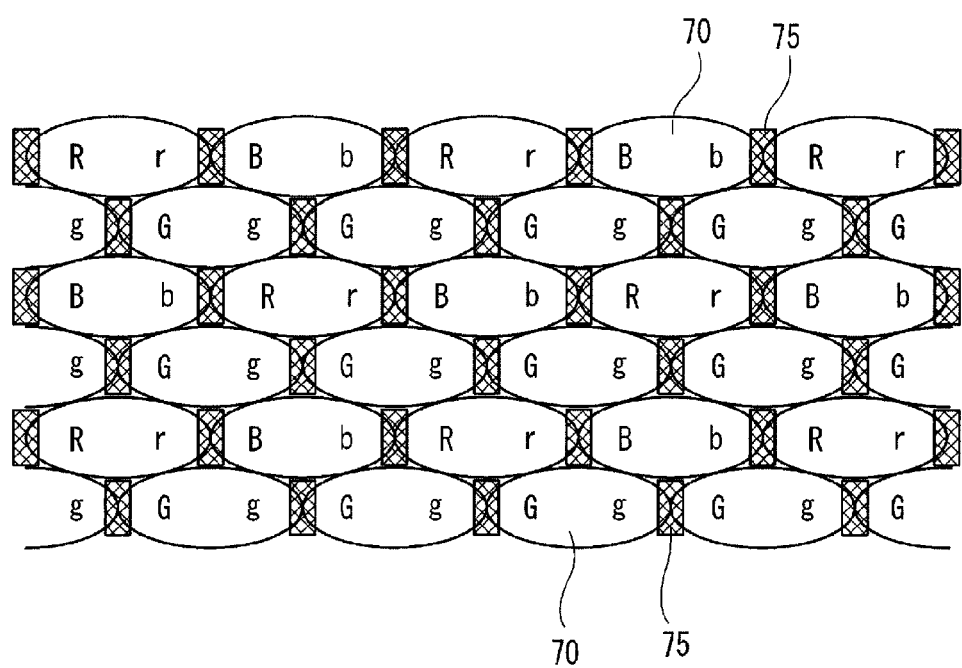
FIG. 13 is a view illustrating a color filter arrangement which is employed in the embodiment of FIG. 12.
Figure 14:
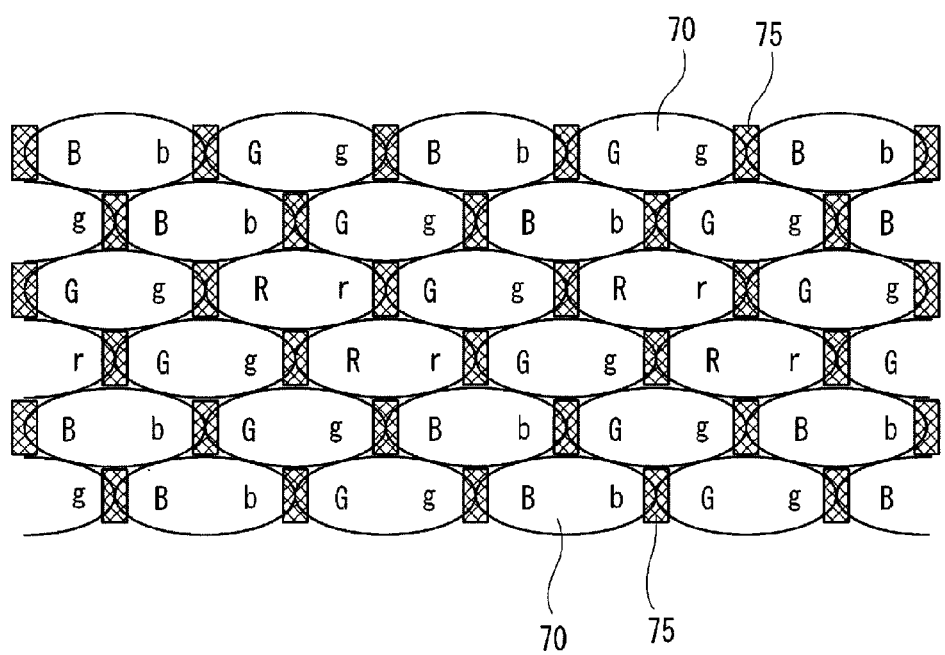
FIG. 14 is a view illustrating a color filter arrangement which is different from that of FIG. 13.

Two pixels which are provided below one elliptical micro lens 70 need to have the same color filters, but the arrangement of the color filters is arbitrary. An example is illustrated in FIGS. 13 and 14. In FIG. 13, the arrangement of the color filters illustrated in FIG. 8 is slanted at 45 degrees to be horizontal. In FIG. 14, in an oblique column of the micro lenses, G filter mounted pixels are provided at every other column and B filters and R filters are alternately provided at every two rows.

Figure 15:
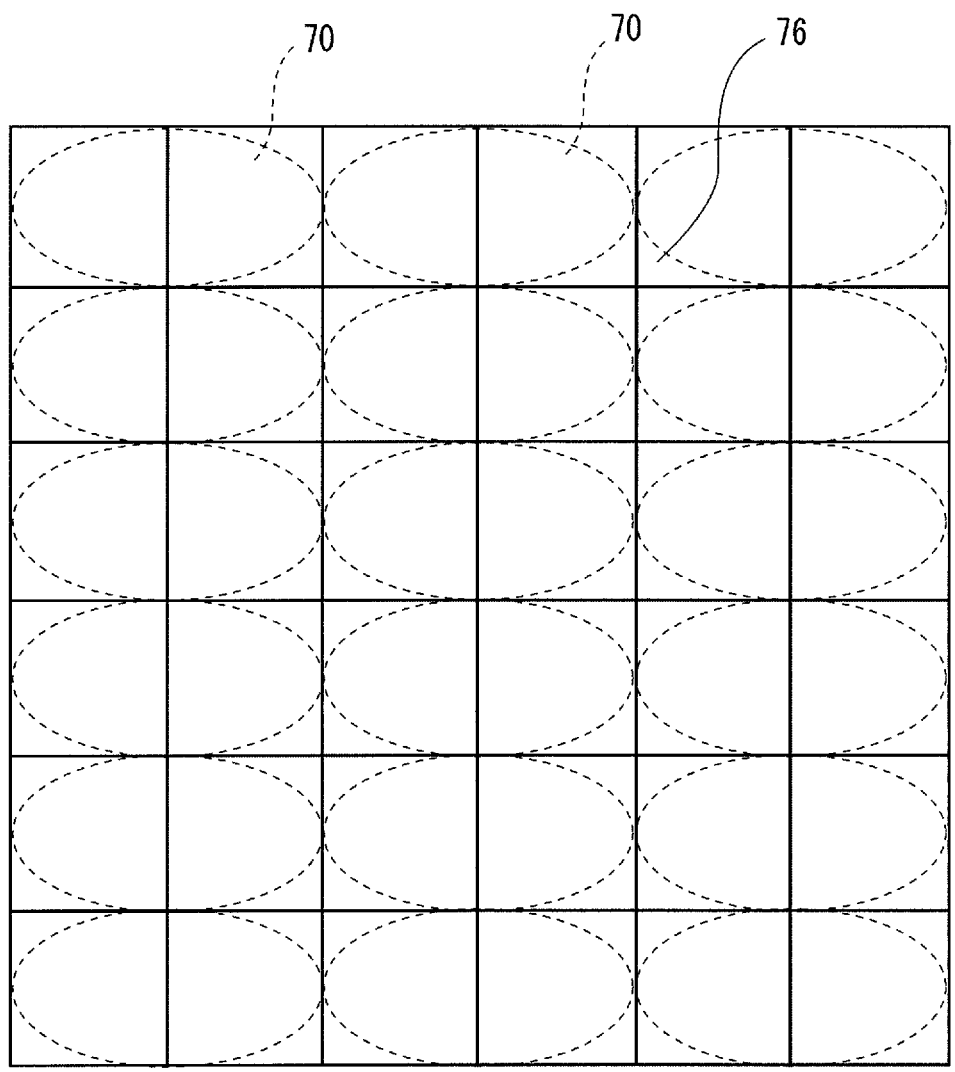
FIG. 15 is a schematic surface view of a solid-state imaging element having a micro lens arrangement which is different from that of FIG. 10.

In the embodiments of FIGS. 8, 12 to 14, columns of micro lenses are shifted by a half pitch at every row. However, as illustrated in FIG. 15, the micro lenses 70 may be arranged without being shifted both in the horizontal direction and the vertical direction. In this case, gaps 76 formed by disposing four micro lenses 70 to be adjacent to each other form a rectangle. Therefore, the reflective wall provided in the position of the gap 76 may be a quadrangular pyramid shaped or a conical reflective wall, which is similar to the embodiments described with reference to FIGS. 4 and 5. When the wedge shaped reflective wall 75 illustrated in FIG. 11 is provided in the gap 76, a plurality of reflective walls 75 is continuous in a vertical direction so that the light receiving sensitivity of each pixel may be lowered. However, a solid-state imaging element equipped with large pixels does not have such a problem.

Figure 16:
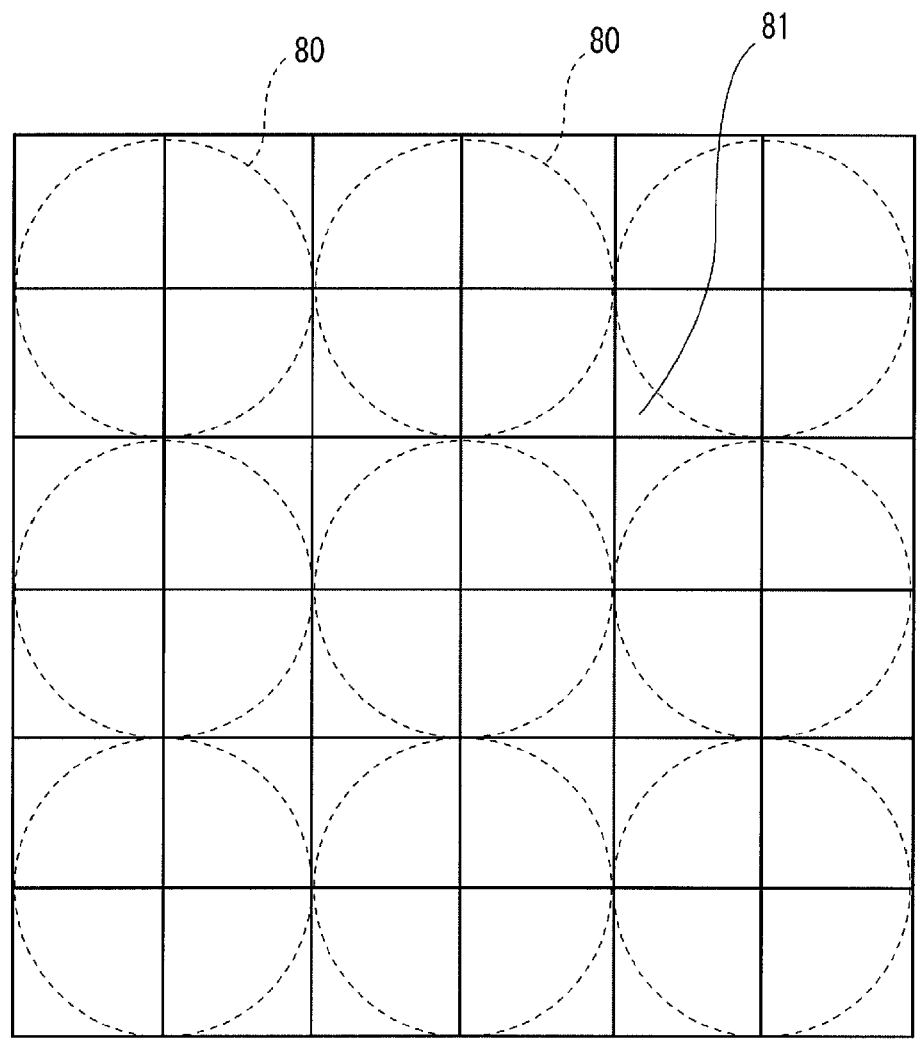
FIG. 16 is a schematic surface view of a solid-state imaging element in which a pixel arrangement is a square lattice arrangement and one micro lens is mounted in four pixels.

FIG. 16 illustrates a solid-state imaging element in which one micro lens 80 is mounted in four pixels. Also in this case, a rectangular gap 81 enclosed by four most adjacent micro lenses 80 is created and the quadrangular pyramid shaped or the conical reflective wall illustrated in FIGS. 4 and 5 may be provided.

In the meantime, the above-described embodiments are employed in a back side illumination type CMOS image sensor but may also be employed in other MOS type image sensors. The embodiments may also be employed in the back side illumination type or a surface illumination type CCD image sensor. In the surface illumination type MOS image sensor, a wiring layer is provided at a light incident side and when the reflective wall 60 is provided in a corresponding portion above the wiring layer, the color mixture may be prevented.

In the solid-state imaging element, in order to prevent a sensitivity of a pixel in the periphery from being lowered, as compared with that of the pixel in the center, as disclosed in Japanese Laid-Open Patent Publication No. H1-213079 or Japanese Laid-Open Patent Publication No. 2007-201090, the position where the micro lens is formed is shifted to a center direction of the light receiving surface with respect to a position where a corresponding charge accumulation area (pixel) is formed. In the case of the solid-state imaging element into which the shading measurement is applied, an isolated columnar reflective wall which is vertically provided in a diagonal direction of the peripheral pixels is obliquely provided corresponding to the shifted position of the micro lens.

As described above, as the embodiments of the photographing device of the present invention, a digital camera has been described, but the configuration of the photographing device is not limited thereto. As other photographing devices of the present invention, an embedded or external camera for a PC, or a portable terminal device which has a photographing function which will be described below may be exemplified.

Examples of a portable terminal device which is an embodiment of the photographing device of the present invention may include a portable phone, a smart phone, a personal digital assistant (PDA), or a portable game device. Hereinafter, as an example, the smart phone will be described in detail with reference to the drawings.

Figure 17:
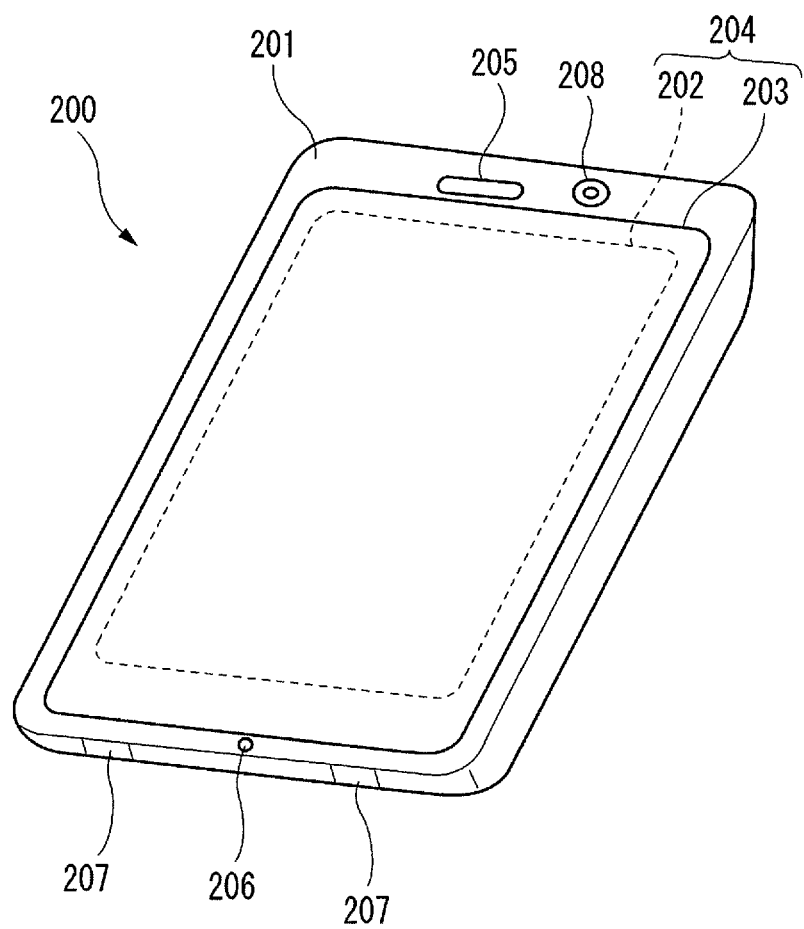
FIG. 17 is a perspective view of an exterior appearance of an imaging device according to another embodiment of the present invention.

FIG. 17 illustrates an outer appearance of a smart phone 200 which is an embodiment of the photographing of the present invention. The smart phone 200 illustrated in FIG. 17 includes a flat panel type housing 201 and is provided, on one surface of the housing 201, with a display input unit 204 in which a display panel 202 as a display unit, and an manipulation panel 203 as an input unit are integrally formed. Such a housing 201 includes a speaker 205, a microphone 206, an manipulation unit 207, and a camera 208. However, the configuration of the housing 201 is not limited thereto. For example, a configuration in which the display unit and the input unit are independent from each other may be employed or a configuration having a folding structure or a slide mechanism may be employed.

Figure 18:
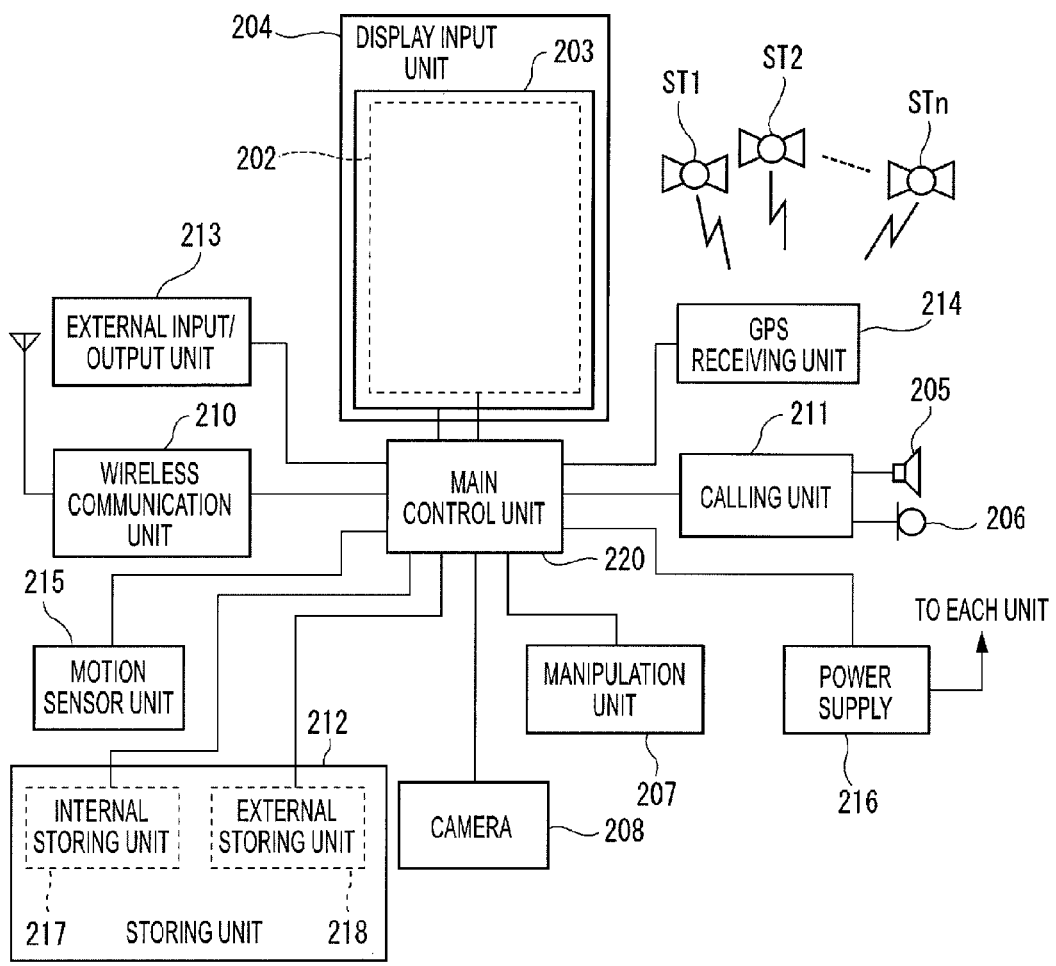
FIG. 18 is a functional block diagram of the imaging device illustrated in FIG. 17.

FIG. 18 is a block diagram illustrating a configuration of the smart phone 200 illustrated in FIG. 17. As illustrated in FIG. 18, as main components, the smart phone includes a wireless communication unit 210, a display input unit 204, a calling unit 211, an manipulation unit 207, a camera 208, a storing unit 212, an external input/output unit 213, a global positioning system (GPS) receiving unit 214, a motion sensor unit 215, a power supply 216, and a main control unit 220. As a main function of the smart phone 200, the smart phone 200 is provided with a wireless communication function which performs mobile wireless communication with a base station device BS which is not illustrated and a mobile communication network NW which is not illustrated.

The wireless communication unit 210 performs wireless communication with the base station device BS which is accommodated in the mobile communication network NW in accordance with an instruction of the main control unit 220. Using the wireless communication, the wireless communication unit 210 transmits/receives various file data such as voice data and image data and electronic mail data or receives web data, streaming data, or the like.

The display input unit 204 is a so-called touch panel which displays an image (a still image or a moving picture) or text information under the control of the main control unit 220 so as to visually transmit information to a user, and detects the user's manipulation on displayed information and includes a display panel 202 and an manipulation panel 203.

The display panel 202 uses a liquid crystal display (LCD), an organic electroluminescence display (OELD), or the like, as a display device. The manipulation panel 203 is a device which is disposed to allow an image displayed on a display surface of the display panel 202 to be visually recognized and detects one or a plurality of coordinates which can be manipulated by a finger of the user or a stylus. When the device is manipulated by the finger of the user or the stylus, a detection signal which is generated based on the manipulation is output to the main control unit 220. Subsequently, the main control unit 220 detects a manipulating position (coordinate) on the display panel 202, based on the received detection signal.

As illustrated in FIG. 17, although the display panel 202 and the manipulation panel 203 of the smart phone 200 exemplified as an embodiment of the photographing device of the present invention are integrally formed with each other to constitute the display input unit 204, the manipulation panel 203 may be disposed to completely cover the display panel 202. When such an arrangement is employed, the manipulation panel 203 may be provided with a function of detecting the user's operation on a region other than the display panel 202. In other words, the manipulation panel 203 may include a detection region (hereinafter, referred to as a "display region") on an overlapping portion which overlaps the display panel 202 and a detection region (hereinafter, referred to as a "non-display region") on an outer peripheral portion which does not overlap the display panel 202.

In the meantime, although the size of the display region and the size of the display panel 202 may completely coincide with each other, both sizes do not necessarily coincide with each other. The manipulation panel 203 may include two sensitive regions of an outer peripheral portion and an inner portion other than the outer peripheral portion. A width of the outer peripheral portion is appropriately designed in accordance with the size of the housing 201. As a position detecting system employed in the manipulation panel 203, a matrix switch system, a resistive layer system, a surface elastic wave system, an infrared system, an electromagnetic induction system, or an electrostatic capacitive system may be exemplified, and any system may be employed.

The calling unit 211 includes the speaker 205 and the microphone 206 and converts the user's voice input through the microphone 206 into voice data to be processed by the main control unit 220 and outputs the converted voice data to the main control unit 220, or decodes voice data received by the wireless communication unit 210 or the external input/output unit 213 and outputs the decoded voice data from the speaker 205. As illustrated in FIG. 17, for example, the speaker 205 may be mounted on the same surface as the surface provided with the display input unit 204 and the microphone 206 may be mounted on a side surface of the housing 201.

The manipulation unit 207 is a hardware key which uses a key switch and receives an instruction from the user. For example, as illustrated in FIG. 17, the manipulation unit 207 is a push button type switch which is mounted on a side surface of the housing 201 of the smart phone 200 and turned on when the manipulation unit 207 is pressed by a finger and turned off by restoring force of a spring when taking the finger off.

The storing unit 212 stores a control program or control data of the main control unit 220, application software, address data to which names, phone numbers, or the like of communication counterparts are correlated, transmitted/received electronic mail data, web data downloaded by web browsing or downloaded content data, and temporally stores streaming data. The storing unit 212 is configured by an internal storing unit 217 which is mounted in the smart phone and an external storing unit 218 which includes a detachable external memory slot. The internal storing unit 217 and the external storing unit 218 which configure the storing unit 212 may be implemented by using a storing medium such as a flash memory type, a hard disk type, a multimedia card micro type, a card type memory (for example, MicroSD (registered trademark) memory), a random access memory (RAM), or a read only memory (ROM).

The external input/output unit 213 functions as an interface with all external devices which are connected to the smart phone 200 and is configured to be directly or indirectly connected to any other external device by communication (for example, universal serial bus (USB) or IEEE1394) or a network (for example, Internet, wireless LAN, Bluetooth (registered trademark), a radio frequency identification (RFID), an infrared data association (IrDA (registered trademark)), ultra wideband (UWB: registered trademark), or a ZigBee (registered trademark).

As external devices connected to the smart phone 200, a wired/wireless head set, a wired/wireless external charger, a wired/wireless data port, a memory card or a SIM (subscriber identity module) card/UIM (user identity module) card connected through a card socket, an external audio/video device connected through an audio/video input/output (I/O) terminal, a wirelessly connected external audio/video device, a wired/wirelessly-connected smart phone, a wired/wirelessly-connected personal computer, a wired/wirelessly-connected PDA, a wired/wirelessly-connected personal computer, or an earphone may be exemplified. The external input/output unit 213 may deliver data which is received from such external devices to individual components in the smart phone 200 and may also allow the data in the smart phone 200 to be transmitted to an external device.

The GPS receiving unit 214 receives GPS signals which are transmitted from GPS satellites ST1 to STn according to an instruction from the main control unit 220 and performs a position measurement operation processing based on the received GPS signals to detect positions including a latitude, a longitude, and a height of the smart phone 200. When the GPS receiving unit 214 may obtain positional information from the wireless communication unit 210 or the external input/output unit 213 (for example, the wireless LAN), the GPS receiving unit 214 may detect a position using that positional information.

The motion sensor unit 215 includes, for example, a three axis acceleration sensor and detects physical movement of the smart phone 200 according to the instruction of the main control unit 220. When the physical movement of the smart phone 200 is detected, the movement direction or acceleration of the smart phone 200 is detected. The detected result is output to the main control unit 220.

The power supply 216 supplies power which is accumulated in a battery (not illustrated) to individual units of the smart phone 200 according to the instruction of the main control unit 220.

The main control unit 220 includes a microprocessor and operates according to a control program or control data stored in the storing unit 212 and integratedly and comprehensively controls individual units of the smart phone 200. The main control unit 220 is provided with a mobile communication control function and an application processing function to control individual units of a communication system in order to perform voice communication or data communication through the wireless communication unit 210.

The application processing function is implemented when the main control unit 220 is operated according to the application software which is stored in the storing unit 212. The application processing function includes, for example, an infrared communication function which performs data communication with a counterpart device by controlling the external input/output unit 213, an electronic mail function which transmits/receives an electronic mail, or a web browsing function which browses a web page.

The main control unit 220 is provided with an image processing function which displays an image on the display input unit 204 based on the image data (still image or moving picture data) such as received data or downloaded streaming data. The image processing function refers to a function of decoding the image data and performing image processings on the decoded result to display the image on the display input unit 204 by the main control unit 220.

The main control unit 220 executes display control of the display panel 202 and an manipulation detection control which detects a user's manipulation through the manipulation unit 207 and the manipulation panel 203. By executing the display control, the main control unit 220 displays an icon used for activating application software or a software key such as a scroll bar or displays a window for preparing an electronic mail. Here, the scroll bar refers to a software key for receiving an instruction to move a displayed portion of an image with respect to a large image which is not covered by the display region of the display panel 202.

When the manipulation detection control is executed, the main control unit 220 detects the user's manipulation through the manipulation unit 207 or receives an operation on the icon or the input of a character string of an input section of the window through the manipulation panel 203 or receives a scroll request of a displayed image through the scroll bar.

By executing the operation detection control, the main control unit 220 determines whether the manipulation position of the manipulation panel 203 is an overlapping portion (display region) which overlaps the display panel 202 or an outer peripheral portion (non-display region) which does not overlap the display panel 202 other than the overlapping portion, and is provided with a touch panel control function that controls a sensitive region of the manipulation panel 203 or a display position of the software key.

The main control unit 220 detects a gesture manipulation with respect to the manipulation panel 203 and executes a predetermined function according to the detected gesture manipulation. The gesture manipulation refers to manipulation which draws a trace using a finger, simultaneously designates a plurality of positions, or a combination thereof to draw a trace for at least one of the plurality of positions, rather than simple touch manipulation of the related art.

The camera unit 208 is a digital camera which electronically photographs a subject using an imaging element such as a complementary metal oxides semiconductor (CMOS) or a charge-coupled device (CCD). The camera unit 208 converts image data obtained by imaging an object into image data compressed in, such as joint photographic coding experts group (JPEG) format in accordance with the control of the main control unit 220 to record the image data in the storing unit 212 or output the image data through the external input/output unit 213 or the wireless communication unit 210. As illustrated in FIG. 17, although the camera 208 is mounted on the same surface as the display input unit 204 in the smart phone 200, the mounting position of the camera 208 is not limited thereto and the camera 208 may be mounted on a rear surface of the display input unit 204 or a plurality of cameras 208 may be mounted. In the meantime, when the plurality of cameras 208 is mounted, the camera 208 which is used for photography is switched to solely perform the photography or the plurality of cameras 208 is simultaneously used to perform the photography.

The camera 208 may be used for various functions of the smart phone 200. For example, an image which is obtained by the camera 208 may be displayed on the display panel 202, or the image of the camera 208 may be used as one of manipulation inputs of the manipulation panel 203. When the GPS receiving unit 214 detects the position, the position may be detected by referring to the image from the camera 208. An optical axis direction of the camera 208 of the smart phone 200 may be determined or a current usage environment may also be determined by referring to the image from the camera 208 either without using the 3-axis acceleration sensor or using the 3-axis acceleration sensor. Of course, the image from the camera 208 can be used in the application software.

Positional information obtained by the GPS receiving unit 214, voice information obtained by the microphone 206 (which may be text information obtained by performing a voice-text conversion by the main control unit or the like), or posture information obtained by the motion sensor unit 215 may be added to the image data of a still image or a moving picture to be stored in the storing unit 212 or output through the external input/output unit 213 or the wireless communication unit 210.

As discussed above, the embodiments disclose an imaging element, including: a semiconductor substrate in which a plurality of pixels is arranged in a two-dimensional array; a color filter layer which is laminated in a position corresponding to the pixel on an upper layer of the semiconductor substrate; a plurality of micro lenses which is laminated on an upper layer of the color filter layer to condense light which is incident onto the pixel; and an isolated columnar reflective wall which is vertically provided in an intermediate layer between the semiconductor substrate and the micro lens at every position of a gap enclosed by the plurality of adjacent micro lenses and reflects the light which is incident onto the color filter from the gap to a direction facing the pixel corresponding to the color filter.

The embodiments disclose the imaging element, in which the reflective wall has a pyramid shape, a conical shape, or a wedged shape whose apex is formed at a color filter layer side.

The embodiments disclose imaging element, in which a shape of the gap enclosed by three micro lenses is a triangle and the reflective wall has a triangular pyramid shape or a conical shape.

The embodiments disclose imaging element, in which a shape of the gap enclosed by four micro lenses is a rectangle and the reflective wall has a quadrangular pyramid shape or a conical shape.

The embodiments disclose imaging element, in which a shape of the gap enclosed by three micro lenses is a triangle and the reflective wall has a wedged shape which connects the adjacent triangular gaps.

The embodiments disclose imaging element, in which the reflective wall has a reflective surface which totally reflects incident light based on a difference of refractive indexes of a constitutional material of the intermediate layer and a constitutional material of the reflective wall.

The embodiments disclose imaging element, in which the reflective wall has a metal reflective surface.

The embodiments disclose imaging element, in which all or a part of the pixels are configured by a pair of phase difference detecting pixels in which light shielding film openings are formed to be off-centered in opposite directions.

The embodiments disclose imaging element, in which each of the micro lenses is commonly provided in the plurality of adjacent pixels in which color filters having the same color are laminated and all the pixels are configured by phase difference detecting pixels which share the micro lenses.

The embodiments disclose an imaging device in which the imaging element is mounted.

According to the above-described embodiments, even in the imaging element in which miniaturization is achieved, the color mixture is suppressed so that the color separation performance is good and the light receiving sensitivity of each pixel is high, and also high speed driving is allowed.

The imaging element according to the present invention has a good color separation performance, a high light receiving sensitivity, and obtains a captured image signal having a high S/N, and thus may be advantageously employed in an imaging device such as a digital camera, a digital video camera, a portable phone with a camera, a small electronic device with a camera, or an electronic endoscopic device. Specifically, the imaging element of the present invention may be advantageously employed in an imaging device which performs the AF method using a phase difference detecting pixel or a monocular 3D camera.

The present application is based on Japanese Patent Application (Patent Application No. 2012-80667) filed on Mar. 30, 2012, the content of which is incorporated herein by reference.

What is claimed is:

1. An imaging element, comprising:
a semiconductor substrate in which a plurality of pixels is arranged in a two-dimensional array;
a color filter layer which is laminated in a position corresponding to the pixel on an upper layer of the semiconductor substrate;
a plurality of micro lenses which is laminated on an upper layer of the color filter layer to condense light which is incident onto the pixel; and
an isolated columnar reflective wall which is vertically provided in an intermediate layer between the semiconductor substrate and the micro lens at every position of a gap enclosed by adjacent three or more of the micro lenses and reflects the light which is incident onto the color filter from the gap to a direction facing the pixel corresponding to the color filter.

2. The imaging element of claim 1, wherein the reflective wall has a pyramid shape, a conical shape, or a wedged shape whose apex is formed at a color filter layer side.

3. The imaging element of claim 2, wherein a shape of the gap enclosed by three micro lenses is a triangle and the reflective wall has a triangular pyramid shape or a conical shape.

4. The imaging element of claim 2, wherein a shape of the gap enclosed by four micro lenses is a rectangle and the reflective wall has a quadrangular pyramid shape or a conical shape.

5. The imaging element of claim 2, wherein a shape of the gap enclosed by three micro lenses is a triangle and the reflective wall has a wedged shape which connects the adjacent triangular gaps.

6. The imaging element of claim 1, wherein the reflective wall has a reflective surface which totally reflects incident light based on a difference of refractive indexes of a constitutional material of the intermediate layer and a constitutional material of the reflective wall.

7. The imaging element of claim 1, wherein the reflective wall has a metal reflective surface.

8. The imaging element of claim 1, wherein all or a part of the pixels are configured by a pair of phase difference detecting pixels in which light shielding film openings are formed to be off-centered in opposite directions.

9. The imaging element of claim 1, wherein each of the micro lenses is commonly provided in the plurality of adjacent pixels in which color filters having the same color are laminated and all the pixels are configured by phase difference detecting pixels which share the micro lenses.

10. An imaging device in which the imaging element of claim 1 is mounted.

* * * * *